(12) United States Patent
Zhang et al.

(10) Patent No.: US 9,780,087 B2
(45) Date of Patent: Oct. 3, 2017

(54) SEMICONDUCTOR DEVICE AND FORMATION METHOD THEREOF

(71) Applicant: Semiconductor Manufacturing International (Shanghai) Corporation, Shanghai (CN)

(72) Inventors: Buxin Zhang, Shanghai (CN); Mengfeng Tsai, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 3 days.

(21) Appl. No.: 14/990,149

(22) Filed: Jan. 7, 2016

(65) Prior Publication Data

US 2016/0204100 A1    Jul. 14, 2016

(30) Foreign Application Priority Data

Jan. 8, 2015  (CN) .......................... 2015 1 0009320

(51) Int. Cl.
| | |
|---|---|
| *H01L 27/06* | (2006.01) |
| *H01L 29/66* | (2006.01) |
| *H01L 49/02* | (2006.01) |
| *H01L 23/485* | (2006.01) |
| *H01L 29/49* | (2006.01) |
| *H01L 23/522* | (2006.01) |
| *H01L 29/51* | (2006.01) |

(52) U.S. Cl.
CPC ........ *H01L 27/0629* (2013.01); *H01L 23/485* (2013.01); *H01L 28/24* (2013.01); *H01L 29/66545* (2013.01); *H01L 23/5228* (2013.01); *H01L 29/4966* (2013.01); *H01L 29/517* (2013.01); *H01L 2924/0002* (2013.01)

(58) Field of Classification Search
CPC ............. H01L 27/0629; H01L 27/0924; H01L 21/823821; H01L 21/823842; H01L 21/823871; H01L 21/823878
See application file for complete search history.

(56) References Cited

U.S. PATENT DOCUMENTS

2013/0200393 A1*  8/2013  Chen ................... H01L 27/0629
                                                      257/77
2013/0234292 A1*  9/2013  Wei ...................... H01L 23/5228
                                                      257/536

(Continued)

*Primary Examiner* — Christine Enad
(74) *Attorney, Agent, or Firm* — Anova Law Group, PLLC

(57) ABSTRACT

The present disclosure provides a semiconductor device and formation method thereof. A shallow trench isolation structure is formed in a semiconductor substrate. A first dielectric layer is formed on the semiconductor substrate. First and second dummy gate structures are formed on the shallow trench isolation structure and through the first dielectric layer. A resistive material layer is formed on the first and second dummy gate structures and on the first dielectric layer between the first and second dummy gate structures. A second dielectric layer is formed on the first dielectric layer and the resistive material layer. A first plug is formed in the second dielectric layer and the resistive material layer and on the first dummy gate structure. A second plug is formed in the second dielectric layer and the resistive material layer and on the second dummy gate structure.

18 Claims, 8 Drawing Sheets

(56) References Cited

U.S. PATENT DOCUMENTS

| | | | |
|---|---|---|---|
| 2013/0277754 A1* | 10/2013 | Liang | H01L 27/0629 257/379 |
| 2016/0020148 A1* | 1/2016 | Song | H01L 23/535 438/238 |
| 2016/0099181 A1* | 4/2016 | Tung | H01L 21/82382 257/369 |

* cited by examiner

SEMICONDUCTOR DEVICE AND FORMATION METHOD THEREOF

CROSS-REFERENCES TO RELATED APPLICATIONS

This application claims the priority of Chinese patent application No. CN201510009320.8, filed on Jan. 8, 2015, the entire content of which is incorporated herein by reference.

FIELD OF THE DISCLOSURE

The present disclosure relates to the field of semiconductor technology and, more particularly, relates to a semiconductor device and formation method thereof.

BACKGROUND

The semiconductor integrated circuit is widely used in various electronic products, such as: cell phones, computers, personal gaming devices, and navigation devices. The semiconductor integrated circuit is formed using a semiconductor fabrication process, for example, to fabricate various transistors, resistors, capacitors and other components on a wafer, and to interconnect the components through multi-layered wirings to form a complete electronic circuit.

Particularly in the integrated circuits for analog circuits and high voltage cables, a large number of resistive elements and transistors are formed on a single chip. In order to reduce the energy consumption of the chip, high precision and high resistance resistor has been widely used.

Heavily doped polysilicon resistors are widely used in the fabrication of integrated circuits. However, due to the difficulty in accurately controlling the polysilicon resistance and specific doping process required by the polysilicon, the production cost of the chip increases.

Conventional solutions include use of a metal nitride material to form high resistance resistors. Such resistors, however, may not be in sufficient contact with conductive plugs.

BRIEF SUMMARY OF THE DISCLOSURE

One aspect of the present disclosure provides a method for forming a semiconductor device. A shallow trench isolation structure is formed in a semiconductor substrate. A first dielectric layer, a first dummy gate structure, and a second dummy gate structure are each formed on a top surface of the semiconductor substrate. The first and second dummy gate structures are formed on the shallow trench isolation structure and through the first dielectric layer. A resistive material layer is formed on a top surface of each of the first and second dummy gate structures and on a top surface of the first dielectric layer between the first and second dummy gate structures. The resistive material layer is used to form a resistor. A second dielectric layer is formed on the first dielectric layer and the resistive material layer. A first through-hole is formed in the second dielectric layer and the resistive material layer to expose the first dummy gate structure. A second through-hole is formed in the second dielectric layer and the resistive material layer to expose the second dummy gate structure. The first through-hole is filled with a metallic material to form a first plug, and the second through-hole is filled with a metallic material to form a second plug.

Another aspect of the present disclosure provides a method for forming a semiconductor device. A semiconductor substrate is provided having a plurality of first regions and a plurality of second regions. A shallow trench isolation structure is formed in the first region of the semiconductor substrate. A first dielectric layer is formed on the semiconductor substrate. A first dummy gate structure, a second dummy gate structure, a first gate structure, and a second gate structure are formed through the first dielectric layer and on the semiconductor substrate. The first and second dummy gate structures are formed on the first region of the semiconductor substrate, and the first and second gate structures are formed on the second region of the semiconductor substrate. A resistive material layer is formed on top surfaces of the first and second dummy gate structures and on a surface of the first dielectric layer located between the first and second dummy gate structures. The resistive material layer is used to form a resistor. A second dielectric layer is formed to cover the first dielectric layer and the resistive material layer. The second dielectric layer and the resistive material layer on the first region are etched to form a first through-hole to expose the first dummy gate structure and to form a second through-hole to expose the second dummy gate structure. The first through-hole is filled with a metallic material to form a first plug passing through the second dielectric layer and the resistive material layer, and on the first dummy gate structure. The second through-hole is filled with a metallic material to form a second plug passing through the second dielectric layer and the resistive material layer, and on the second dummy gate structure.

Another aspect of the present disclosure provides a semiconductor device. A shallow trench isolation (STI) structure is in a semiconductor substrate. A first dielectric layer is on the semiconductor substrate containing the STI structure. A first dummy gate structure and a second dummy gate structure are in the first dielectric layer and on the STI structure. The first dummy gate structure is located on one side of the second dummy gate structure. A resistive material layer is on top surfaces of the first and second dummy gate structures and on a surface of the first dielectric layer located between the first and second dummy gate structures, the resistive material layer being used to form a resistor. A second dielectric layer is on the first dielectric layer and the resistive material layer. A first plug passes through the second dielectric layer and the resistive material layer and on the first dummy gate structure. A second plug passes through the second dielectric layer and the resistive material layer and on the second dummy gate structure.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
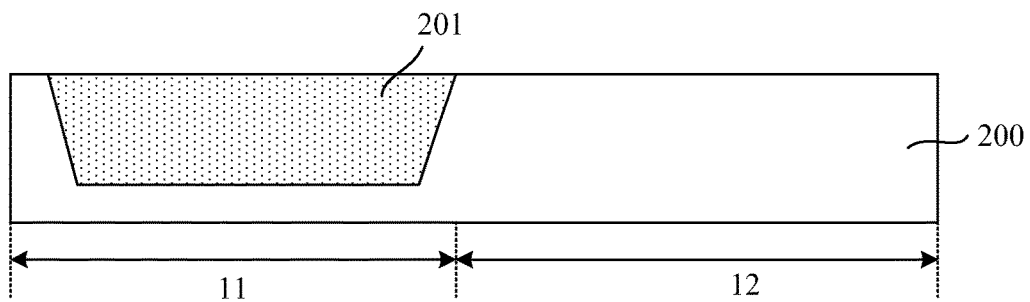
FIGS. 1-7 illustrate cross sectional structures of an exemplary semiconductor device corresponding to certain stages of a fabrication process consistent with various disclosed embodiments.

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention.

Resistors formed using a metal nitride material may not be in sufficient contact with plugs or conductive plugs. The disclosed methods and semiconductor devices are directed to solve the problem set forth above or other problems in the art.

To form a metal nitride resistor, a semiconductor substrate may be provided to form a shallow trench isolation structure therein. A metal nitride material layer may be formed on the shallow trench isolation structure to become a resistor. A dielectric layer may be formed covering the semiconductor substrate, the shallow trench isolation structure, and the metal nitride material layer. The dielectric layer may be etched to form an opening exposing the metal nitride material layer. The opening may be filled with metallic material to form a plug. The metal nitride material layer usually has a thin thickness, and may not function as an etch stop layer when the dielectric layer is etched. Thus, when forming the opening, it is difficult to control a precise location of the bottom of the opening. The electrical connection between the plug (formed in the opening) and the metal nitride material layer may not be desirably provided. The performance of the formed integrated circuit may be affected.

The present disclosure provides a semiconductor device and the formation method thereof. When a gate structure (such as a metal gate structure) of a transistor is formed in a first dielectric layer, a first dummy gate structure (such as a first dummy metal gate structure), and a second dummy gate structure (such as a second dummy metal gate structure) may be formed on a shallow trench isolation structure in the first dielectric layer. For example, when the metal gate structure is formed using a chemical mechanical polishing (CMP) planarization process, the first dummy metal gate structure and the second dummy metal gate structure may reduce the hardness difference between the first dielectric layer in the first regions and the first dielectric layer in the second regions to prevent forming concave defects in the first dielectric layer. When the first dielectric layer and a resistive material layer are etched, the first dummy metal gate structure and the second dummy metal gate structure may function as an etch stop layer to increase the location precision of bottom of a first opening and precision of a first plug formed in the first opening by filling metallic material, and to increase the location precision of bottom of a second opening and precision of a second plug formed in the second opening by filling metallic material.

Further, due to the contact between the top surfaces of the first dummy metal gate structure and the second dummy metal gate structure with bottom surface of the resistive material layer, the formed first plug and the second plug may not only have electrical connection to the resistive material layer at top surfaces, but also have electrical connection to the first dummy metal gate structure and the second dummy metal gate structure at bottom surfaces. Thus, through the first dummy metal gate structure and the second dummy metal gate structure, the first plug and the second plug may have enlarged area to contact the resistive material layer resulting in a performance increase in the electrical connection between the first and the second plugs and the resistive material layer. Further, the resistor formation process provided by the present disclosure is compatible with the transistor metal gate formation process. Thus, the fabrication cost may be reduced.

In the exemplary embodiments, the schematic diagrams may be enlarged disproportionally to more conveniently show the specific details of interest, which should not limit the scope of the present invention. In addition, the actual fabrication processes may be performed to provide three dimensions of a length, a width and a depth.

Figure 18:
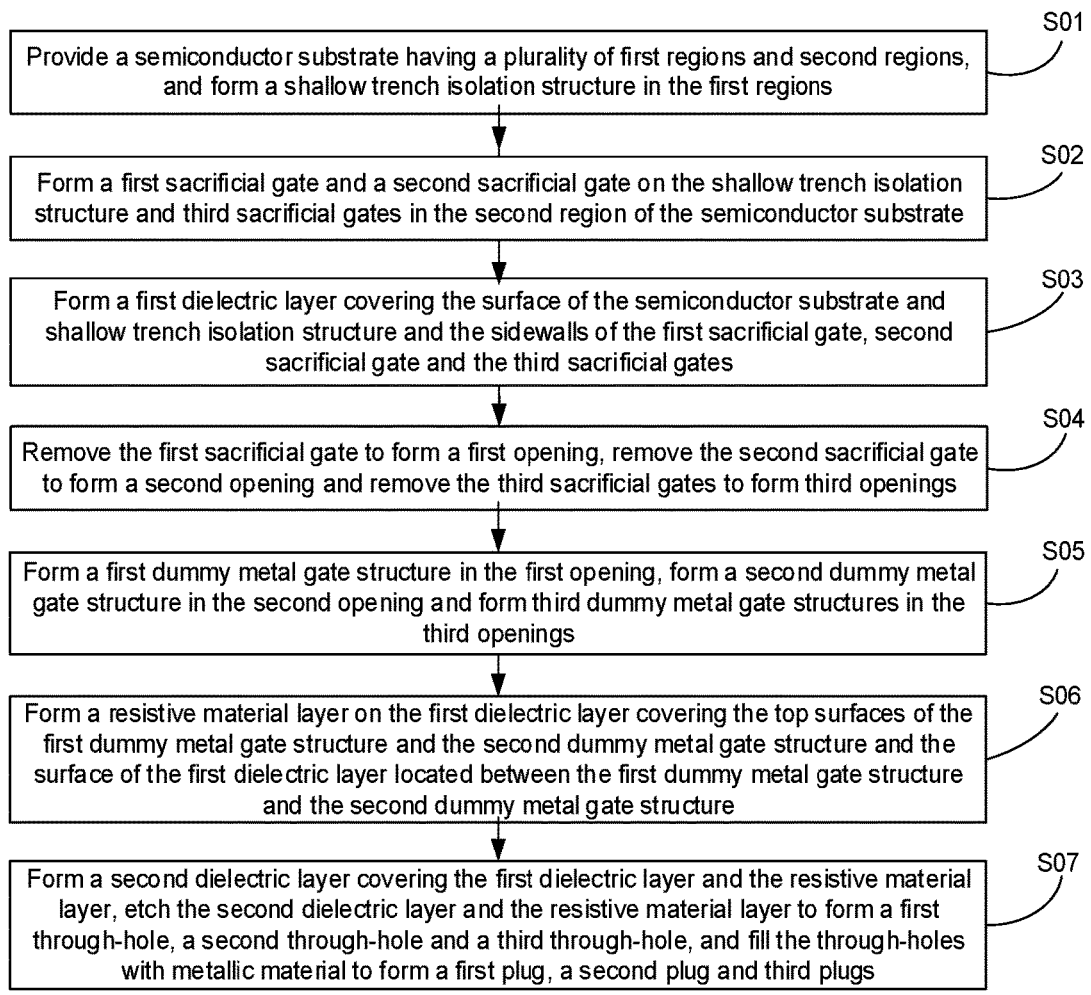
FIG. 18 illustrates a flow chart of an exemplary method for fabricating a semiconductor device consistent with various disclosed embodiments.

FIGS. 1-7 illustrate cross sectional structures of an exemplary semiconductor device corresponding to certain stages of a fabrication process consistent with various disclosed embodiments. FIG. 18 illustrates a flow chart of an exemplary method for fabricating a semiconductor device consistent with various disclosed embodiments.

As shown in FIG. 18, at the beginning of the fabrication process, a semiconductor substrate having a plurality of first regions and second regions is provided. A shallow trench isolation structure is formed in the first regions of the semiconductor substrate (S01). FIG. 1 illustrates a cross-sectional view of a corresponding structure of the exemplary semiconductor device consistent with the disclosed embodiments.

As shown in FIG. 1, a semiconductor substrate 200 is provided. The semiconductor substrate 200 may have a plurality of first regions 11 and second regions 12. A shallow trench isolation structure 201 may be formed in the first regions 11 of the semiconductor substrate 200.

The semiconductor substrate 200 may be made of any appropriate semiconductor materials, such as silicon, germanium, silicon germanium, silicon carbide, etc. The semiconductor substrate 200 may also be made of any appropriate composite materials, such as silicon on insulator (SOI), germanium on insulator (GOI), etc. The semiconductor substrate 200 may also be made of Group III-V compounds, such as, gallium arsenide, gallium nitride, indium antimonide, indium arsenide, indium phosphide, etc. By design, the semiconductor substrate 200 may be doped with impurity ions to alter the electrical property.

The semiconductor substrate 200 may include a plurality of first regions 11 and second regions 12. The first regions 11 may be an isolation region. A shallow trench isolation structure 201 may be formed in the first regions 11 of the semiconductor substrate 200. A first dielectric layer may be formed on the shallow trench isolation structure 201. Then, a resistor may be formed on the first dielectric layer. The second regions 12 may be an active region. A transistor may be formed in the second regions 12 of the substrate 200. The formed transistor may be a MOS transistor or a fin-type field effect transistor.

There may be one or more first and second regions. Each second region may be located between adjacent first regions. The shallow trench isolation structure 201 formed in the first regions 11 may be used to electrically isolate adjacent second regions 12. For illustration purposes, only one first region and one adjacent second region on the semiconductor substrate 200 are shown in the figures as an example.

To form the shallow trench isolation structure 201, a patterned hard mask layer (not shown) may be formed on the semiconductor substrate 200. The patterned hard mask layer may have a plurality of openings exposing the semiconductor substrate 200 ready to be etched. The patterned hard mask layer may be used as an etch mask to etch the semiconductor substrate 200 to form a plurality of trenches. A barrier material layer may be formed in the trenches and on the surface of the patterned hard mask layer. Chemical mechanical polishing process may be used to remove the barrier material layer and the patterned hard mask layer on the surface of the semiconductor substrate 200. Then the shallow trench isolation structure 201 may be formed in the trench.

The shallow trench isolation structure may be made of silicon oxide, silicon oxynitride, or any other similar materials.

The shallow trench isolation structure 201 may be a single layer or a multiple layer stacked (≥2 layers) structure. In one embodiment, the shallow trench isolation structure is a double layer stacked structure, including a silicon oxide pad layer located on the sidewalls and the bottom of the trench and a silicon oxide filler layer located on the surface of the silicon oxide pad layer.

In other embodiments, a fin structure may be formed in the second regions of the semiconductor substrate 200.

Figure 2:
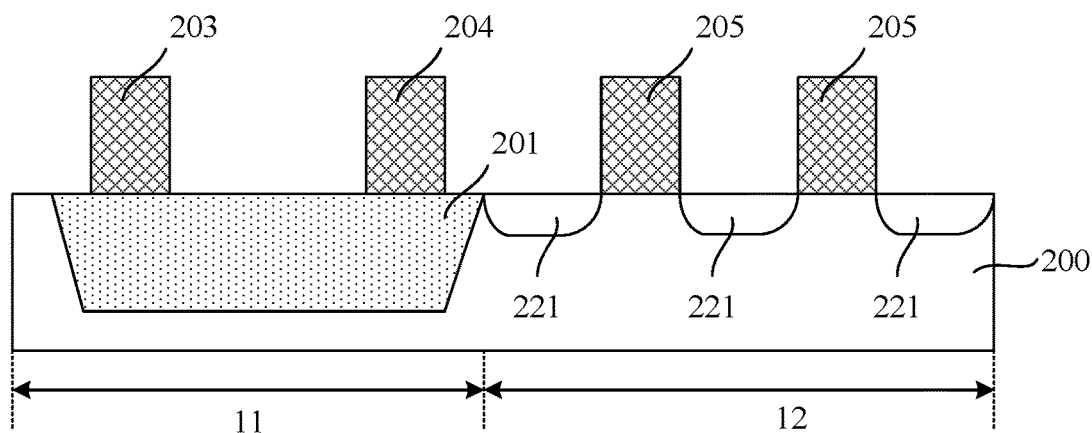

Returning to FIG. 18, a first dummy gate and a second dummy gate are formed on the shallow trench isolation structure and a third dummy gate is formed in the second region of the semiconductor substrate (S02). FIG. 2 illustrates a cross-sectional view of a corresponding structure of the exemplary semiconductor device consistent with the disclosed embodiments.

As shown in FIG. 2, a first sacrificial gate 203 and a second sacrificial gate 204 may be formed on the shallow trench isolation structure 201 and third sacrificial gates 205 may be formed in the second region 12 of the semiconductor substrate 200.

The number of each of the first sacrificial gate 203, the second sacrificial gate 204 and the third sacrificial gates 205 may be at least one.

The first sacrificial gate 203 may be located on one side of the second sacrificial gate 204. The first sacrificial gate 203 and the second sacrificial gate 204 function as sacrificial layers. After the first sacrificial gate 203 and the second sacrificial gate 204 are subsequently removed, a first dummy gate structure (such as a first dummy metal gate structure) and a second dummy gate structure (such as a second dummy metal gate structure) may be formed in the locations of the first sacrificial gate 203 and the second sacrificial gate 204 respectively.

Moreover, when a first dielectric material layer is planarized to form a first dielectric layer, the first sacrificial gate 203 and the second sacrificial gate 204 may reduce the hardness difference between the first dielectric layer in the first region 11 of the semiconductor substrate 200 and the first dielectric layer in the second region 12 of the semiconductor substrate 200 to prevent forming concave defects on the surface of the first dielectric layer in the first region 11. Residual metallic material trapped in the concave defects may be prevented when a metal gate structure is subsequently formed.

The third sacrificial gates 205 may function as sacrificial layers. After the third sacrificial gates 205 are subsequently removed, a transistor (metal) gate structure may be formed in the location corresponding to the third sacrificial gates 205.

The first sacrificial gate 203, the second sacrificial gate 204 and the third sacrificial gates 205 may be formed in a same process. For example, a sacrificial gate material layer may be formed on the semiconductor substrate 200. A patterned mask layer, such as a photoresist mask layer may be formed on the sacrificial gate material layer. The patterned mask layer may be used as an etch mask to etch the sacrificial gate material layer to form a first sacrificial gate 203 and a second sacrificial gate 204 on the shallow trench isolation structure 201, and third sacrificial gates 205 in the second region 12 of the semiconductor substrate 200.

Each of the first sacrificial gate, the second sacrificial gate and the third sacrificial gate may be made of polysilicon, amorphous silicon, amorphous carbon, etc. In one embodiment, the first sacrificial gate, the second sacrificial gate and the third sacrificial gates are made of polysilicon.

After the first sacrificial gate 203, the second sacrificial gate 204 and the third sacrificial gates 205 are formed, spacers (not shown) may be formed on the sidewalls of each of the first sacrificial gate 203, the second sacrificial gate 204 and the third sacrificial gate 205.

The spacers may include a single layer structure or a multiple layer stacked (≥2 layers) structure. In one embodiment, the spacers include a single layer structure. The spacers may be made of silicon oxide, silicon nitride, silicon oxynitride, etc. In another embodiment, the spacers include a double layer stacked structure, including offset spacers located on the sidewalls of the first sacrificial gate 203, the second sacrificial gate 204 and the third sacrificial gate 205, and main spacers located on the surface of the offset spacers. The offset spacers may be made of silicon oxide, etc. The main spacers may be made of silicon nitride, etc.

Further, the third sacrificial gates 205 or both the third sacrificial gates 205 and the spacers may be used as a mask for an ion implantation process to form transistor source/drain regions 221 on both sides of the third sacrificial gates 205 in the second region 12 of the semiconductor substrate 200. A source/drain 221 region may include a lightly (or shallowly) doped region and a heavily (or deeply) doped region located in the semiconductor substrate 200.

In the ion implantation process, the type of impurity ions may depend on the type of transistors to be formed. Specifically, when the transistor to be formed is a PMOS transistor, P-type ions may be implanted. When the transistor to be formed is an NMOS transistor, N-type ions may be implanted. The N-type ions may include phosphorus ions, arsenic ions, antimony ions, or combinations thereof.

In other embodiments, a fin structure is formed in the second region of the semiconductor substrate. For example, a third sacrificial gate may cover across the sidewalls and the top surface of a length of the fin structure. Source/drain regions of a fin-type field-effect transistor (FinFET) are formed in the fin structure on both sides of the third sacrificial gate.

Figure 3:
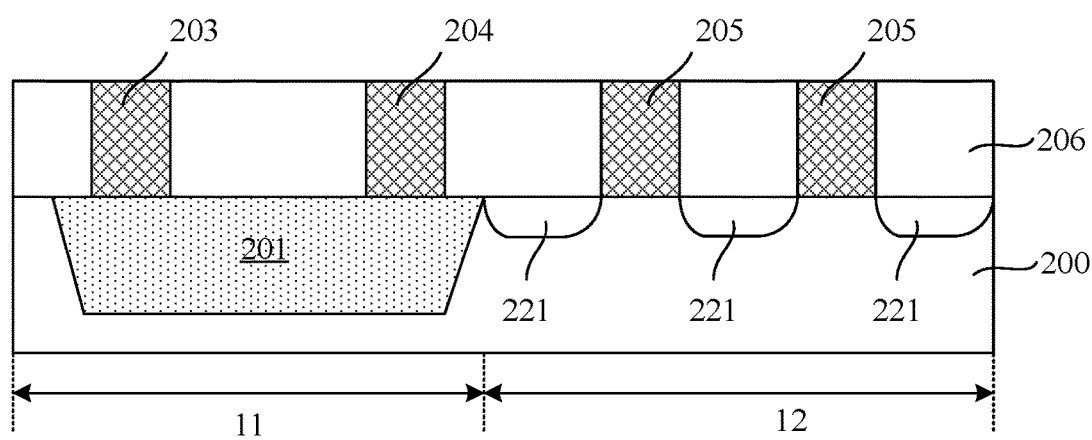

Returning to FIG. 18, a first dielectric layer is formed covering the surface of the semiconductor substrate and the shallow trench isolation structure and the sidewalls of the first sacrificial gate, second sacrificial gate and the third sacrificial gates. A top surface of the first dielectric layer is coplanar with the top surfaces of the first sacrificial gate, the second sacrificial gate and the third sacrificial gates (S03). FIG. 3 illustrates a cross-sectional view of a corresponding structure of the exemplary semiconductor device consistent with the disclosed embodiments.

As shown in FIG. 3, a first dielectric layer 206 may be formed covering the surface of the semiconductor substrate 200 and the shallow trench isolation structure 201 and the sidewalls of the first sacrificial gate 203, second sacrificial gate 204 and the third sacrificial gate 205. The top surface of the first dielectric layer 206 may be coplanar with the top surfaces of the first sacrificial gate 203, the second sacrificial gate 204 and the third sacrificial gates 205.

To form the first dielectric layer 206, a first dielectric material layer may be formed covering the surfaces of the semiconductor substrate 200, the first sacrificial gate 203, the second sacrificial gate 204, the third sacrificial gates 205 and the shallow trench isolation structure 201. Using chemical mechanical polishing process and using the top surfaces of the first sacrificial gate 203, the second sacrificial gate 204 and the third sacrificial gates 205 as an etch stop layer, the first dielectric material layer may be planarized to form a first dielectric layer 206 on the semiconductor substrate 200.

The first dielectric layer 206 may be made of silicon oxide, etc.

In other embodiments, a fin structure (not shown) may be formed in the second region of the semiconductor substrate. In this case, one or both third sacrificial gates may cover the sidewalls and the top surface of a length of the fin structure, and the first dielectric layer may cover the surface of the fin structure.

Figure 4:
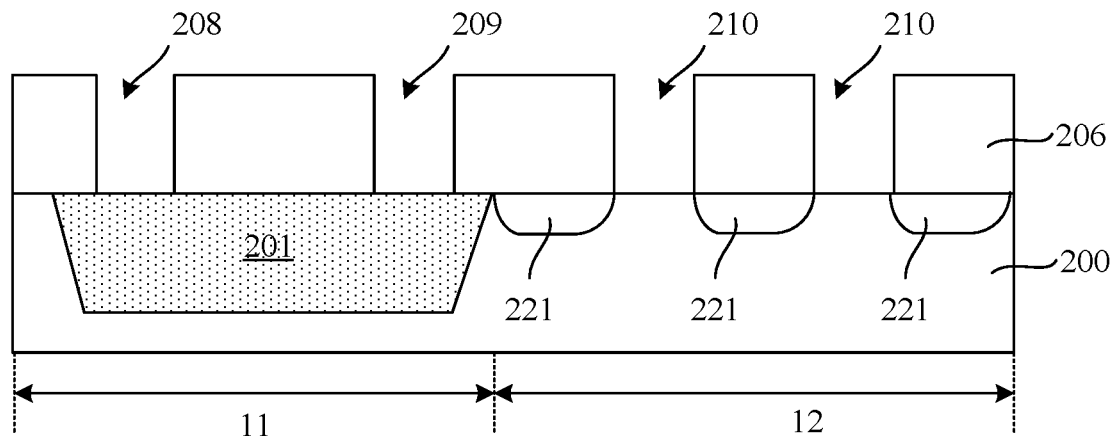

Returning to FIG. 18, the first sacrificial gate is removed to form a first opening; the second sacrificial gate is removed to form a second opening; and the third sacrificial gates are removed to form third openings (S04). FIG. 4 illustrates a cross-sectional view of a corresponding structure of the exemplary semiconductor device consistent with the disclosed embodiments.

As shown in FIG. 4, the first sacrificial gate 203 may be removed to form a first opening 208; the second sacrificial gate 204 may be removed to form a second opening 209; and the third sacrificial gates 205 may be removed to form third openings 210.

The process for removing the first sacrificial gate 203, the second sacrificial gate 204 and the third sacrificial gates 205 may be a wet etching and/or a dry etching process. In specific embodiments, when a dry etching process is used to remove the first sacrificial gate 203, the second sacrificial gate 204 and the third sacrificial gates 205, the dry etching process is a plasma etching process. The etching gas used in the plasma etching process may include HBr, $Cl_2$, etc. When a wet etching process is used to remove the first sacrificial gate 203, the second sacrificial gate 204 and the third sacrificial gates 205, the etching solution used in the wet etching process may be a tetramethylammonium hydroxide (TMAH) solution, a KOH solution, etc.

Figure 5:
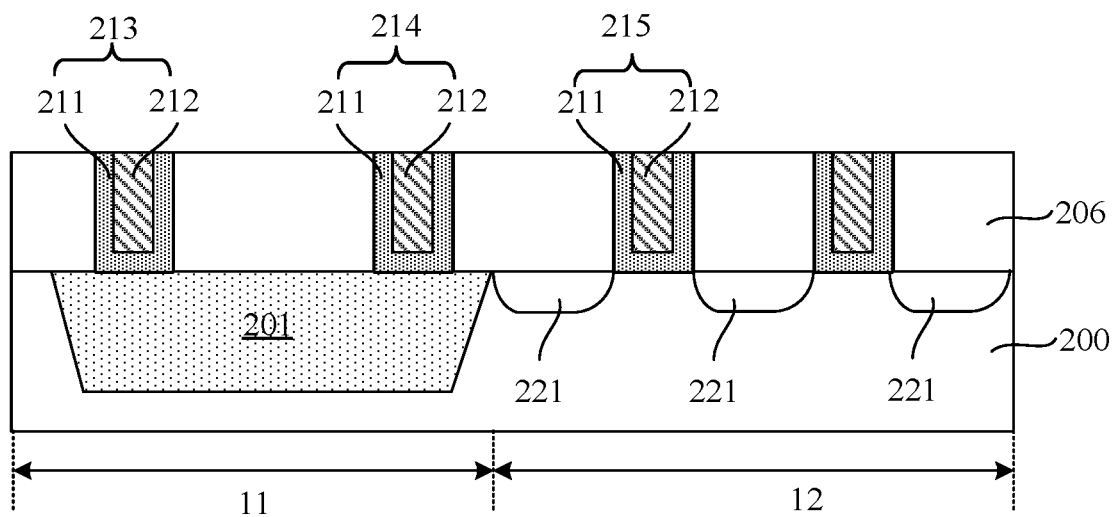

Returning to FIG. 18, a first dummy gate structure (such as a first dummy metal gate structure) is formed in the first opening; a second dummy gate structure (such as a second dummy metal gate structure) is formed in the second opening; and gate structures (such as metal gate structures) are formed in the third openings (S05). FIG. 5 illustrates a cross-sectional view of a corresponding structure of the exemplary semiconductor device consistent with the disclosed embodiments.

As shown in FIG. 5, a first dummy metal gate structure 213 may be formed in the first opening 208; a second dummy metal gate structure 214 may be formed in the second opening 209; and metal gate structures 215 may be formed in the third openings 210.

The first dummy metal gate structure 213, the second dummy metal gate structure 214 and the metal gate structures 215 may share the same formation structure and the same formation process such that the fabrication cost may be saved.

Each of the first dummy metal gate structure 213, the second dummy metal gate structure 214 and the metal gate structures 215 may include a high K dielectric layer 211 and a metal layer 212 located on the high K dielectric layer 211.

To form the first dummy metal gate structure 213, the second dummy metal gate structure 214 and the metal gate structures 215, a high K dielectric material layer may be formed on the surface of first dielectric layer 206 and on the sidewalls and the bottom surfaces of the first opening 208, the second opening 209 and the third openings 210. A metal material layer may be formed on the high K dielectric material layer. Using chemical mechanical polishing process, the high K dielectric material layer and the metal material layer on the first dielectric layer may be planarized and removed to form a first dummy metal gate structure 213 in the first opening 208, a second dummy metal gate structure 214 in the second opening 209 and metal gate structures 215 in the third openings 210.

The high K dielectric layer 211 may be made of $HfO_2$, $TiO_2$, HfZrO, HfSiNO, $Ta_2O_5$, $ZrO_2$, $ZrSiO_2$, $Al_2O_3$, $SrTiO_3$, BaSrTiO or other suitable high dielectric constant materials. The metal layer 212 may be made of one or more of W, Al, Cu, Ti, Ag, Au, Pt, Ni or other suitable conductive materials. In one embodiment, the high K dielectric layer 211 is made of $HfO_2$ and the metal layer 212 is made of W.

In other embodiments, a work function layer and a barrier metal layer are formed between the metal layer 212 and the high-K dielectric layer 211, and the barrier metal layer is located on the high-K dielectric layer and the work function layer is located on the barrier metal layer. The work function layer is used to adjust the work function of a transistor to be formed. The barrier metal layer is used to isolate the high-K dielectric layer and the work function layer. The work functional layer material may be made of Ti, Ta, TiN, TaN, TiAl, TaC, TaSiN, TiAlN, or other suitable metal or metal compound. The barrier metal layer may be made of TiN.

The metal gate structures 215 may be gate structures for forming the transistor, while in some cases the first and second dummy metal gate structures 213/214 may or may not (e.g., be removed later) be gate structures in the final transistor. For example, at least one of the gate structures may be formed across sidewall surfaces and a top surface of a length of at least one fin structure of the semiconductor substrate in the second region.

In one aspect, when the metal gate structures 215 are formed, the first dummy metal gate structure 213 and the second dummy metal gate structure 214 may reduce the hardness difference between the first dielectric layer 206 in the first region 11 and the first dielectric layer 206 in the second region 12 to prevent forming concave defects on the first dielectric layer 206 in the first region 11 when the high K dielectric layer and the metal layer are removed through planarization. In another aspect, the resistive material layer may be formed subsequently on the first dielectric layer 206 in the first region 11 covering the top surfaces of the first dummy metal gate structure 213 and the second dummy metal gate structure 214. Thus, when the second dielectric material layer and the resistive material layer are etched to form the first opening and the second opening, the first dummy metal gate structure 213 and the second dummy metal gate structure 214 may function as an etch stop layer.

Figure 6:
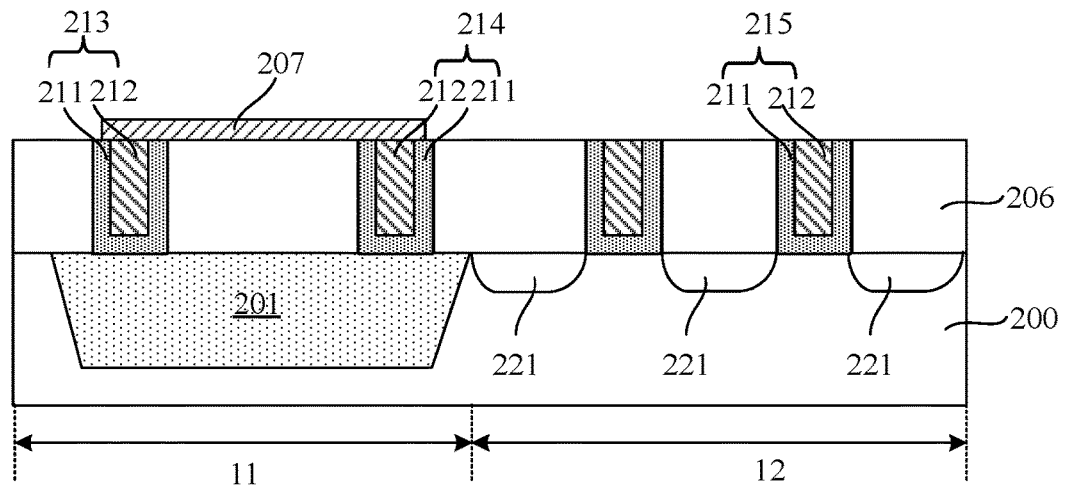

Returning to FIG. 18, a resistive material layer is formed on the first dielectric layer covering the top surfaces of the first dummy metal gate structure and the second dummy metal gate structure and the surface of the first dielectric layer located between the first dummy metal gate structure and the second dummy metal gate structure (S06). FIG. 6 illustrates a cross-sectional view of a corresponding structure of the exemplary semiconductor device consistent with the disclosed embodiments.

As shown in FIG. 6, a resistive material layer 207 may be formed on the first dielectric layer 206 covering the top surfaces of the first dummy metal gate structure 213 and the second dummy metal gate structure 214 and the surface of the first dielectric layer 206 located between the first dummy metal gate structure 213 and the second dummy metal gate structure 214. The resistive material layer 207 may become a resistor.

The resistive material layer 207 may be made of a metal or a metal nitride. Specifically, the resistive material layer 207 may be made of TiN, TaN, Ti, Ta, W, etc. In one embodiment, the resistive material layer 207 is made of TiN with a thickness ranging approximately from 10 angstroms to 500 angstroms.

The resistive material layer 207 may cover at least the surface of the metal layer 212 in each of the first dummy metal gate structure 213 and the second dummy metal gate structure 214 and the surface of the first dielectric layer 206 located between the first dummy metal gate structure 213 and the second dummy metal gate structure 214. In one aspect, the contact area between the metal layer 212 and the resistive material layer 207 may be enlarged. Through the metal layer 212, the contact area between the subsequently formed first plug and second plug and the resistive material layer 207 may be enlarged as well. Thus the connection may be improved. In another aspect, when the second dielectric layer and the resistive material layer 207 are subsequently etched to form the first through-hole and the second through-hole, the metal layer 212 may function as an etch stop layer to precisely control the location of the bottoms of the subsequently formed first and second through-holes, such that the locations of the first and second plugs formed in the first and second through-holes may have high precision, and the electrical connection performance between the first and second plugs and the resistive material layer 207 may be improved.

To form the resistive material layer 207, sputtering and etching process may be used. Specifically, a thin film of high resistance material may be formed on the first dielectric layer 206 by sputtering. The excessive high resistance film may then be removed by the etching process to form the resistive material layer 207 on the first dielectric layer 206 in the first region 11.

Figure 7:
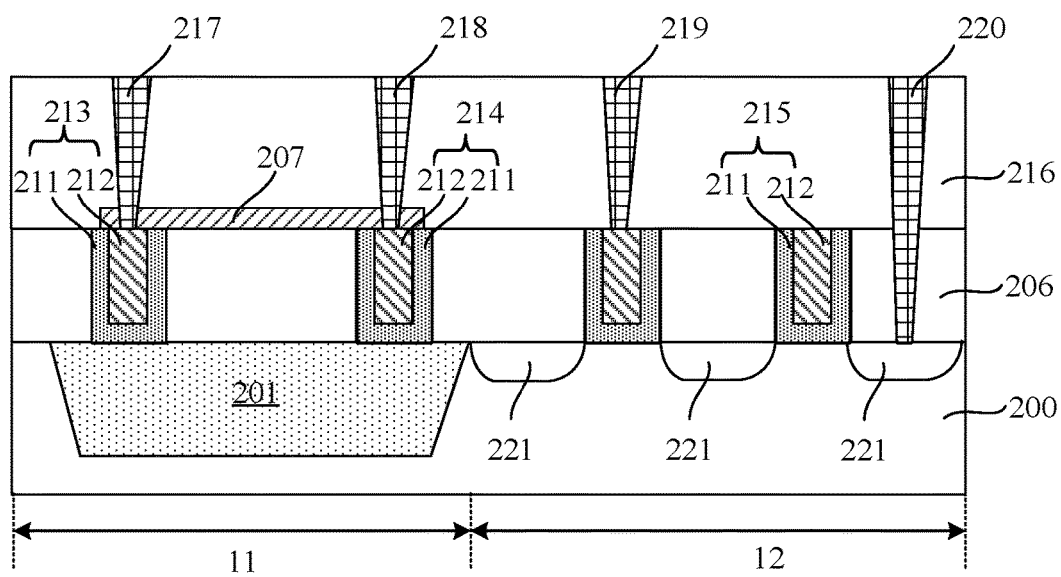

Returning to FIG. 18, a second dielectric layer is formed covering the first dielectric layer and the resistive material layer. The second dielectric layer and the resistive material layer are etched to form a first through-hole exposing the first dummy metal gate structure and a second through-hole exposing the second dummy metal gate structure. The first through-hole is filled with metallic material to form a first plug and the second through-hole is filled with metallic material to form a second plug (S07). FIG. 7 illustrates a cross-sectional view of a corresponding structure of the exemplary semiconductor device consistent with the disclosed embodiments.

As shown in FIG. 7, a second dielectric layer 216 may be formed covering the first dielectric layer 206 and the resistive material layer 207. The second dielectric layer 216 and the resistive material layer 207 may be etched to form a first through-hole exposing the first dummy metal gate structure 213 and a second through-hole exposing the second dummy metal gate structure 214. The first through-hole may be filled with metallic material to form a first plug 217 and the second through-hole may be filled with metallic material to form a second plug 218.

The second dielectric layer may be made of silicon oxide, ultra-low K (K≤3) dielectric material (such as porous SiCOH, etc.), or other suitable dielectric material.

The second dielectric layer 216 and the resistive material layer 207 may be etched using an anisotropic dry etching process, such as a plasma etching process. In one embodiment, the plasma etching process for etching the second dielectric layer 216 uses a carbon and fluorine containing etching gas including $CF_4$, $C_4F_8$ or other suitable gas. The plasma etching process used in etching the resistive material layer 207 uses an etching gas including $Cl_4$ or other suitable gas.

Prior to etching the second dielectric layer 216, a patterned mask layer may be formed on the second dielectric layer 216.

At the same time when the second dielectric layer 216 and the resistive material layer 207 in the first region 11 are etched, the second dielectric layer 216 and the first dielectric layer 206 in the second region 12 may be etched to form a third through-hole (e.g., corresponding to plug 219 in FIG. 7) in the second dielectric layer 216 in the second region 12, exposing the surface of the metal layer 212 of at least one of the metal gate structures 215. A fourth through-hole (e.g., corresponding to plug 220 in FIG. 7) may be formed in the second dielectric layer 216 and the first dielectric layer 206 exposing the surfaces of the source/drain regions 211 of a corresponding gate structure, e.g., one of the metal gate structures 215.

At the same time when the first and the second through-holes are filled with metallic material, the third through-hole may be filled with metallic material to form a third plug. The third plug may be electrically connected to a metal gate structure 215. The fourth through-hole may be filled with metallic material to form a fourth plug. The forth plug may be electrically connected to one of the source/drain regions 221 of at least one of the metal gate structures 215.

The metallic material may be W, Al, Cu or other suitable metal. The metal filling process may be sputtering or metal plating. After filling the metallic material, any excessive metal on the surface of the second dielectric layer 216 may be removed using chemical mechanical polishing process.

Referring to FIG. 7, one embodiment provides a semiconductor structure including: a semiconductor substrate 200 having a first region 11 and a second region 12; a shallow trench isolation structure 201 located in the semiconductor substrate 200 in the first region 11; a first dummy metal gate structure 213 and a second dummy metal gate structure 214 on the shallow trench isolation structure 201, the second dummy metal gate structure 214 located on one side of the first dummy metal gate structure 213; a metal gate structure 215 on the semiconductor substrate 200 in the second region 12; a first dielectric layer 206 covering the semiconductor substrate 200, the first dummy metal gate structure 213, the second dummy metal gate structure 214 and the metal gate structure 215 and being coplanar with the top surfaces of the first dummy metal gate structure 213, the second dummy metal gate structure 214 and the metal gate structure 215; a resistive material layer 207 on the first dielectric layer 206 covering the top surfaces of the first dummy metal gate structure 213 and the second dummy metal gate structure 214 and the surface of the first dielectric layer 206 located between the first dummy metal gate structure 213 and the second dummy metal gate structure 214, the resistive material layer 207 may form a resistor; a second dielectric layer 216 covering the first dielectric layer 206 and the resistive material layer 207; a first through-hole exposing the first dummy metal gate structure 213 and a second through-hole exposing the second dummy metal gate structure 214 located in the second dielectric layer 216 and the resistive material layer 207; and a first plug 217 in the first through-hole and a second plug 218 in the second through-hole.

The semiconductor structure further includes: a source/drain region 221 located beside the metal gate structure 215 in the semiconductor substrate 200 in the second region 12; a third plug 219 electrically connected to the metal gate structure 215 in the second dielectric layer 216; and a fourth plug 220 electrically connected to the source/drain region 211 in the first dielectric layer 206 and the second dielectric layer 216.

In this embodiment, it should be noted that the descriptions and limitations of the semiconductor structure may be referred to the same of the foregoing fabrication process and are not discussed here.

FIGS. 8-14 illustrate cross sectional structures of another exemplary semiconductor device corresponding to certain stages of a fabrication process consistent with various disclosed embodiments.

Referring to FIGS. 8-14, it should be noted that the descriptions and limitations of the semiconductor structures at various fabrication stages for forming the another semiconductor device may be referred to the same or similar step(s) of the foregoing fabrication process as depicted in FIGS. 1-7, which then may not be described in great detail.

Figure 8:
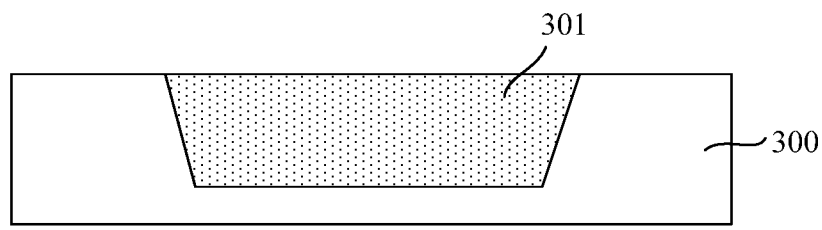
FIGS. 8-14 illustrate cross sectional structures of another exemplary semiconductor device corresponding to certain stages of a fabrication process consistent with various disclosed embodiments.

As shown in FIG. 8, a semiconductor substrate 300 may be provided having a shallow trench isolation structure 301 therein.

Figure 9:
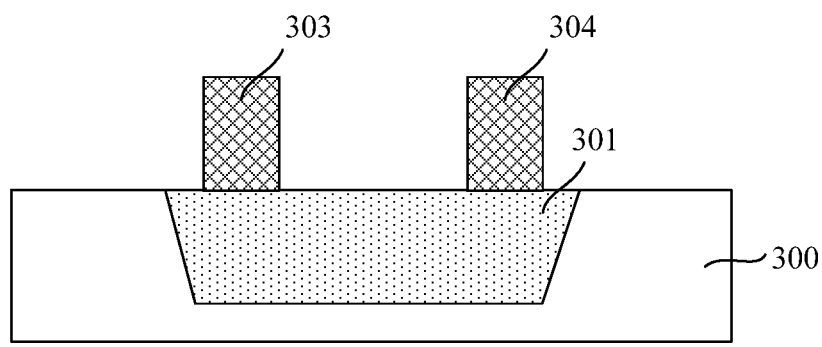

As shown in FIG. 9, a first sacrificial gate 303 and a second sacrificial gate 304 may be formed on the shallow trench isolation structure 301.

Figure 10:
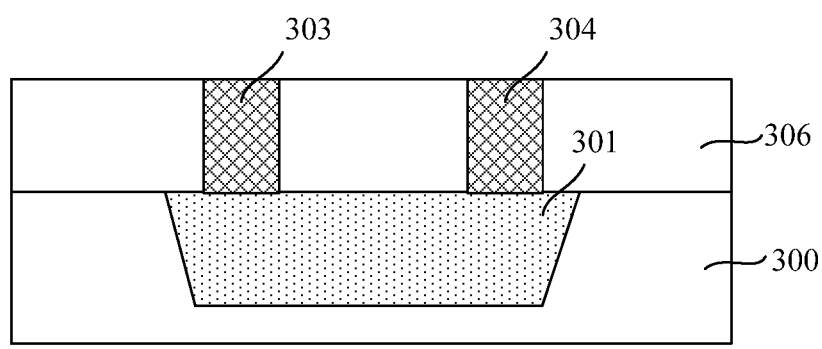

As shown in FIG. 10, a first dielectric layer 306 may be formed covering the surfaces of the semiconductor substrate 300 and the shallow trench isolation structure 301 and the sidewalls of the first sacrificial gate 303 and the second sacrificial gate 304. The top surface of the first dielectric layer 306 may be coplanar with the top surfaces of the first sacrificial gate 303 and the second sacrificial gate 304.

Figure 11:
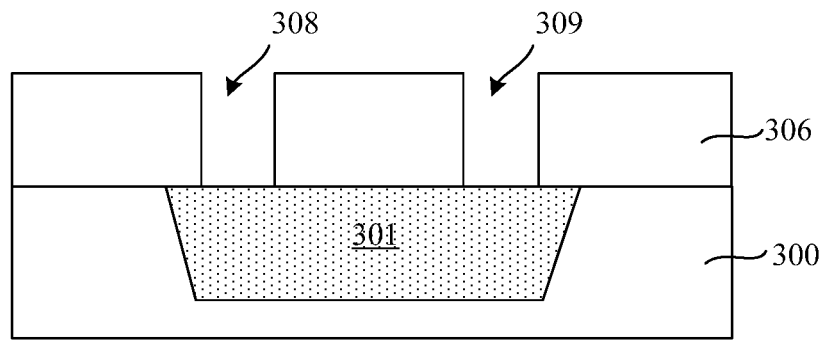

As shown in FIG. 11, the first sacrificial gate 303 (referring to FIG. 10) may be removed to form a first opening 308 and the second sacrificial gate 304 (referring to FIG. 10) may be removed to form a second opening 309. Similarly, third sacrificial gate(s) (e.g., similar to third sacrificial gates 205 in FIG. 3) may be formed and then removed to form third opening(s).

Figure 12:
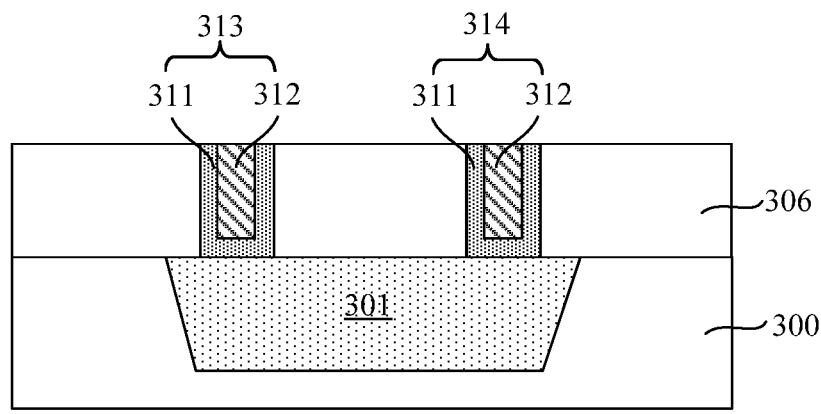

As shown in FIG. 12, a first dummy metal gate structure 313 may be formed in the first opening 308 (referring to FIG. 11) and a second dummy metal gate structure 314 may be formed in the second opening 309 (referring to FIG. 11).

The first dummy metal gate structure 313 and the second dummy metal gate structure 314 may include a high K dielectric layer 311 and a metal layer 312 located on the high K dielectric layer 311.

To form the first dummy metal gate structure 313 and the second dummy metal gate structure 314, a high K dielectric material layer may be formed on the surface of the first dielectric layer 306 and on the sidewalls and bottom surfaces of the first opening 308 and the second opening 309. A metal material layer may be formed on the high K dielectric material layer. Using chemical mechanical polishing process, the high K dielectric material layer and the metal material layer may be removed through planarization to form a first dummy metal gate structure 313 in the first opening 308, a second dummy metal gate structure 314 in the second opening 309 and a metal gate structure(s) in the third opening(s).

The high K dielectric layer 311 may be made of $HfO_2$, $TiO_2$, $HfZrO$, $HfSiNO$, $Ta_2O_5$, $ZrO_2$, $ZrSiO_2$, $Al_2O_3$, $SrTiO_3$, $BaSrTiO$, or other suitable high dielectric constant material. The metal layer 312 may be made of one or more of W, Al, Cu, Ti, Ag, Au, Pt, Ni, or other suitable conductive material. In one embodiment, the high K dielectric layer 311 is made of $HfO_2$ and the metal layer 312 is made of W.

In other embodiments, a work function layer and a barrier metal layer may be formed between the metal layer 312 and the high K dielectric layer 311. The barrier metal layer may be located on the high K dielectric layer and the work function layer may be located on the metal layer. The work function layer may be used to adjust the work function of the formed transistor. The barrier metal layer may be used to isolate the high K dielectric layer and the work function layer.

Figure 13:
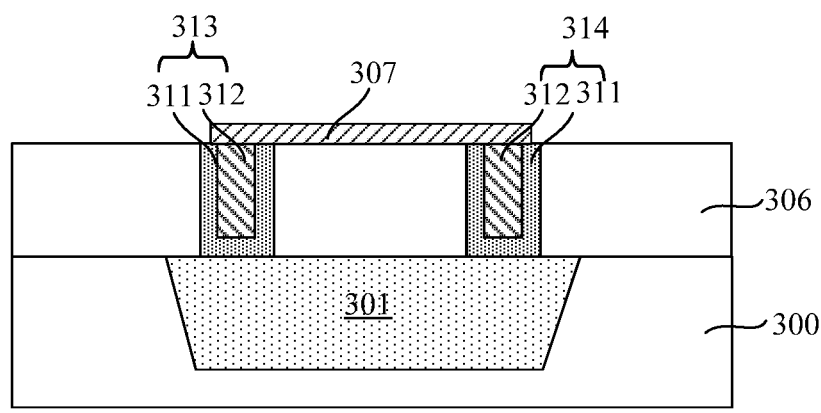

As shown in FIG. 13, a resistive material layer 307 may be formed on the first dielectric layer 306 covering the top surfaces of the first dummy metal gate structure 313 and the second dummy metal gate structure 314 and the surface of the first dielectric layer 306 located between the first dummy metal gate structure 313 and the second dummy metal gate structure 314. The resistive material layer 307 may be used to form a resistor.

The resistive material layer 307 may be made of a metal or a metal nitride. Specifically, the resistive material layer 307 may be made of TiN, TaN, Ti, Ta, W, etc. In one embodiment, the resistive material layer 307 is made of TiN with a thickness ranging approximately from 10 angstroms to 500 angstroms.

The resistive material layer 307 may cover at least the surface of the metal layers 312 in the first dummy metal gate structure 313 and the second dummy metal gate structure 314, and the surface of the first dielectric layer 306 located between the first dummy metal gate structure 313 and the second dummy metal gate structure 314.

In one aspect, the contact area between each metal layer 312 and the resistive material layer 307 may be enlarged. Through the metal layer 312, the contact area between the subsequently formed first plug 317 (and/or second plug 318) and the resistive material layer 307 may be enlarged as well. Thus the connection may be improved.

In another aspect, when the second dielectric layer 316 and the resistive material layer 307 are subsequently etched to form the first through-hole and the second through-hole, the metal layer 312 may function as an etch stop layer to precisely control the location of the bottoms of the subsequently formed first and second through-holes, such that the locations of the first and second plugs 317/318 formed in the first and second through-holes may have high precision and the electrical connection performance between the first (and/or second) plugs and the resistive material layer 307 may be improved.

To form the resistive material layer 307, sputtering and etching process may be used. Specifically, a thin film of high resistance material may be formed on the first dielectric layer 306 by sputtering. The excessive high resistance film may then be removed by the etching process to form the resistive material layer 307 on the first dielectric layer 307.

Figure 14:
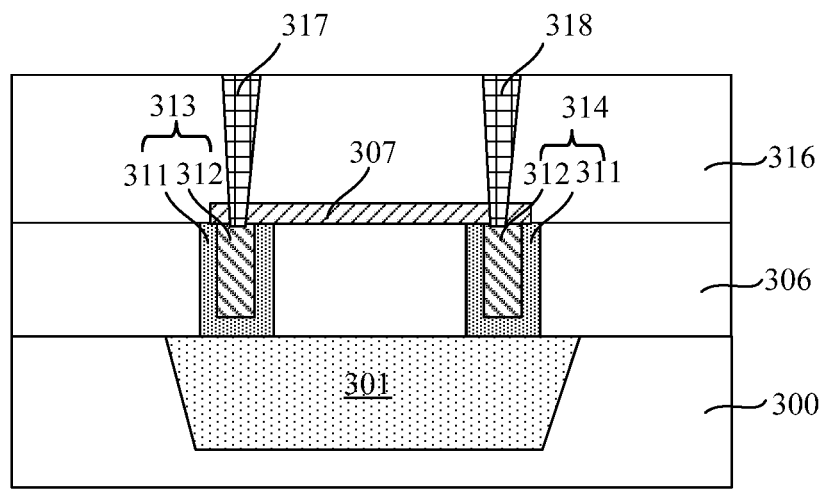

As shown in FIG. 14, a second dielectric layer 316 may be formed covering the first dielectric layer 306 and the resistive material layer 307. The second dielectric layer 316 and the resistive material layer 307 may be etched to form a first through-hole exposing the first dummy metal gate structure 313 and a second through-hole exposing the second dummy metal gate structure 314. The first through-hole may be filled with metallic material to form a first plug 317 and the second through-hole may be filled with metallic material to form a second plug 318.

The second dielectric layer 316 and the resistive material layer 307 may be etched using an anisotropic dry etching process, such as a plasma etching process. In one embodiment, the plasma etching process for etching the second dielectric layer 316 uses a carbon and fluorine containing etching gas including $CF_4$, $C_4F_8$ or other suitable gas. The plasma etching process for etching the resistive material layer 307 uses an etching gas including $Cl_4$ or other suitable gas(es).

Referring back to FIG. 14, one embodiment may provide a semiconductor structure, including: a semiconductor substrate 300 having a shallow trench isolation structure 301 formed in the semiconductor substrate 300; and a first dielectric layer 306 covering the shallow trench isolation structure 301 and the semiconductor substrate 300. A first dummy metal gate structure 313 and a second dummy metal gate structure 314 are formed in the first dielectric layer 306, and the first dummy metal gate structure 313 is located on one side of the second dummy metal gate structure 314. The semiconductor device in FIG. 14 further includes a resistive material layer 307 located on the first dielectric layer 306 covering the top surfaces of the first dummy metal gate structure 313 and the second dummy metal gate structure 314 and the surface of the first dielectric layer 306 located between the first dummy metal gate structure 313 and the second dummy metal gate stricture 314. The resistive material layer 307 may be used to form a resistor. A second dielectric layer 316 covers the first dielectric layer 306 and the resistive material layer 307. A first through-hole may expose the first dummy metal gate structure 313 in the second dielectric layer 316 and the resistive material layer 307 and a second through-hole may expose the second dummy metal gate structure 314 in the second dielectric layer 316 and the resistive material layer 307. A first plug 317 is located in the first through-hole and a second plug 318 is located in the second through-hole.

The first dummy metal gate structure 313 and the second dummy metal gate structure 314 may include a high K dielectric layer 311 and a metal layer 312 located on the high K dielectric layer 311.

In one embodiment, a high resistance resistor (e.g., made by resistive material layer 207/307) may be provided with a resistance ranging from about 500 Ohm/sq to about 1000 Ohm/sq. The resistor may be made of a metal film such as TiN, but may not be limited to the TiN material. The resistor may be made post metal gate CMP process. The resistor film pattern (e.g., resistive material layer 207/307) may be defined from logic operation of a metal gate (e.g., metal gate 212 shown in FIG. 6) and the resistor contact connection is lading on the metal gate. The resistor connection port is made by the resistor film (e.g., resistive material layer 207/307) overlapping with metal gate (e.g., metal gate 212) to have good electric connection.

In various embodiments, the shallow trench isolation (STI) structure 201 can be made according to transistors to be formed or otherwise involved in the present disclosure. Any types of transistors, for example, FinFET transistors and/or planar transistors depicted in FIGS. 1-14, may be formed on the semiconductor substrate 200. In one embodiment, when FinFET devices, for example, as shown in FIGS. 15-17, are formed on the semiconductor substrate 200, for example, over the second region 12 of the substrate, the semiconductor substrate may include one or more Fin structures isolated by isolation structures between adjacent Fin structures.

Figure 15:
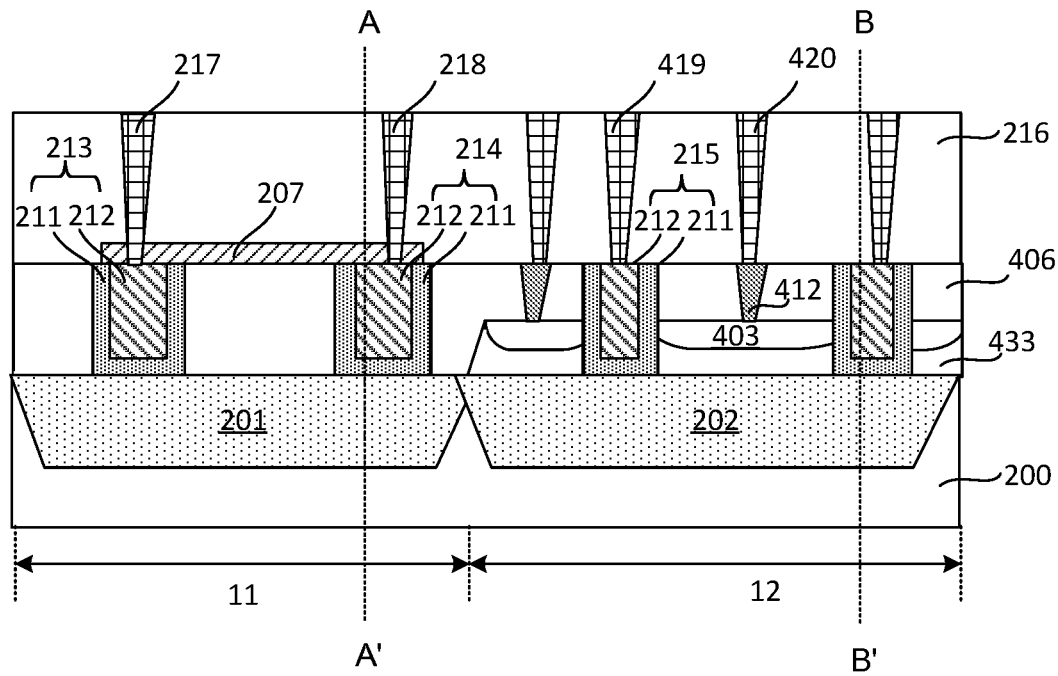
FIGS. 15-17 illustrate cross sectional structures of another exemplary semiconductor device consistent with various disclosed embodiments.
Figure 16:
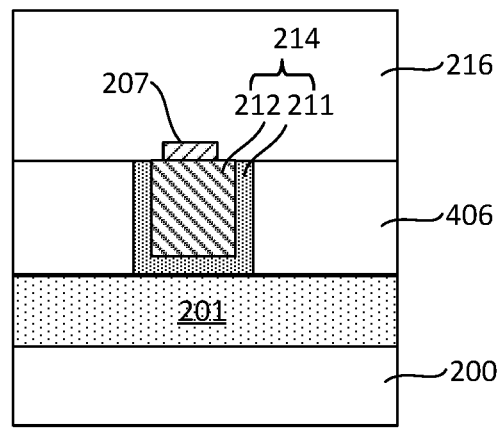
Figure 17:
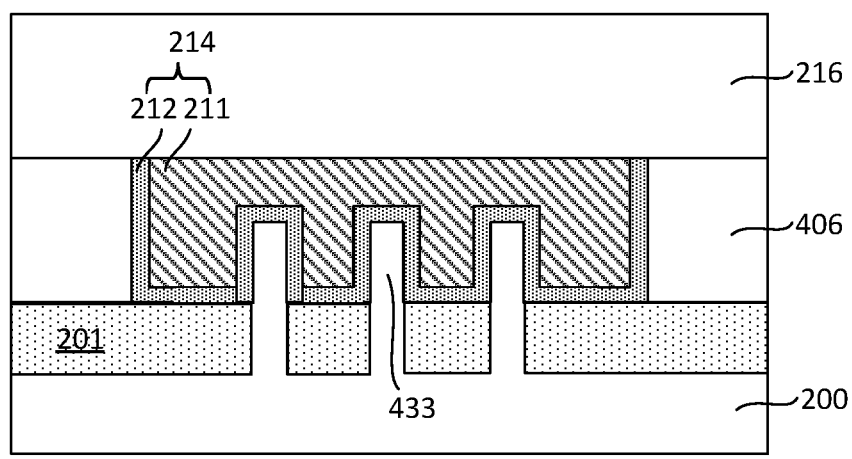

Referring to FIGS. 15-17, cross sectional structures of another exemplary semiconductor device are shown in consistent with various disclosed embodiments. It should be noted that the descriptions and limitations of the semiconductor structures at various fabrication stages for forming this exemplary semiconductor device may be referred to the same or similar step(s) of the foregoing fabrication process as depicted in FIGS. 1-7, which then may not be described in great detail.

Referring to FIGS. 15-17, the exemplary semiconductor structure may include: a semiconductor substrate 200 having a first region 11 and a second region 12; a first shallow trench isolation structure 201 located in the semiconductor substrate 200 in the first region 11; a first dummy metal gate structure 213 and a second dummy metal gate structure 214 on the shallow trench isolation structure 201, the second dummy metal gate structure 214 located on one side of the first dummy metal gate structure 213; and a second shallow trench isolation structure 202 located on the semiconductor substrate 200 in the second region 12.

The second region 12 of semiconductor substrate 200 includes a fin structure 433 that penetrates through and protrudes from the second shallow trench isolation structure 202. The semiconductor structure shown in FIGS. 15-17 further includes: a metal gate structure 215 on the second shallow trench isolation structure 202 in the second region 12, the metal gate structure 215 wrapping-around the fin structure 433; and a first dielectric layer 406 covering the semiconductor substrate 200 including the fin structure 433, the first dummy metal gate structure 213, the second dummy metal gate structure 214 and the metal gate structure 215 and being coplanar with the top surfaces of the first dummy metal gate structure 213, the second dummy metal gate structure 214 and the metal gate structure 215.

The semiconductor structure shown in FIGS. 15-17 further includes: a resistive material layer 207 on the first dielectric layer 406 covering at least the top surfaces of the first dummy metal gate structure 213 and the second dummy metal gate structure 214 and the surface of the first dielectric layer 406 located between the first dummy metal gate structure 213 and the second dummy metal gate structure 214, the resistive material layer 207 may be used to form a resistor; a second dielectric layer 216 covering the first dielectric layer 406 and the resistive material layer 207; a first through-hole exposing the first dummy metal gate structure 213 and a second through-hole exposing the second dummy metal gate structure 214 located in the second dielectric layer 216 and the resistive material layer 207; and a first plug 217 in the first through-hole and a second plug 218 in the second through-hole.

The semiconductor structure shown in FIGS. 15-17 further includes: a source/drain region 403 located on both sides of the metal gate structure 215 in an upper portion (or sometimes covering the entire thickness) of the fin structure 433 of the semiconductor substrate 200 in the second region 12; a third plug 419 electrically connected to the metal gate structure 215 in the second dielectric layer 216; and a fourth plug 412 electrically connected to the source/drain region 403 in the first dielectric layer 406 and a fifth plug 420 electrically connected to the fourth plug 412 in the second dielectric layer 216.

Turning to FIG. 16, a cross sectional structure of the first region 11 of the exemplary semiconductor device along the AA' direction in connection with FIG. 15 is shown. As illustrated, a first shallow trench isolation structure 201 is located in the semiconductor substrate 200; a second dummy metal gate structure 214 is on the shallow trench isolation structure 201; a first dielectric layer 406 covers the semiconductor substrate 200 including the shallow trench isolation structure 201 and the second dummy metal gate structure 214; a resistive material layer 207 on the first dielectric layer 406 covering the top surfaces of the second dummy metal gate structure 214, the resistive material layer 207 may be used to form a resistor; and a second dielectric layer 216 covering the first dielectric layer 406 and the resistive material layer 207.

Turning to FIG. 17, a cross sectional structure of the second region 12 of the exemplary semiconductor device along the BB' direction in connection with FIG. 15 is shown. As illustrated, a second shallow trench isolation structure 202 is located on the semiconductor substrate 200; multiple fin structures 433 may penetrate through and protrude from a top surface of the second shallow trench isolation structure 202; a metal gate structure 215 is located on the second shallow trench isolation structure 202, the metal gate structure 215 wraps-around the multiple fin structures 433; a first dielectric layer 406 covers the semiconductor substrate 200 including second shallow trench isolation structure 202 and the multiple fin structures 433 and the metal gate structure 215 and has a top surface coplanar with the top surfaces of the metal gate structure 215; and a second dielectric layer 216 covering the first dielectric layer 406.

In various embodiments, the exemplary semiconductor device shown in FIGS. 15-17 may be formed from a semiconductor substrate 200 such as a silicon substrate. STI structures 201 and 202 may then be formed in this exemplary silicon substrate. Fin structures may then be formed on the second region 12, while the first STI structure 201 is exposed. After the fin structures 433 are formed, e.g., by patterning and etching process via a photolithographic process, the first dielectric layer 406 may be formed to cover the entire surface, including the exposed first region 11 (including the first STI structure 201), the fin structures 433, and the second region 12 of the semiconductor substrate 200 exposed by the fin structures 433. Gate structures 213, 214, and 215 may then be formed on the STI structures 201-202 and in the first dielectric layer 406, followed by forming the fourth plug 412, the resistive material layer 207, the second dielectric layer 216, and the conductive plugs 217, 218, 419, and 420, for example, using similar processes as depicted in FIGS. 1-7 and/or FIGS. 8-14.

In various other embodiments, the exemplary semiconductor device shown in FIGS. 15-17 may be formed from a semiconductor substrate 200, for example, including a bottom silicon layer of a silicon-on-insulator (SOI) substrate. The oxide layer in the SOI substrate may then be used as STI structures 201 and 202. The top silicon layer of the SOI substrate may be patterned and etched to remove the portion from the first region 11 and to form fin structures 433 over the second region 12 of the semiconductor substrate 200, e.g., by a photolithographic process. After the fin structures 433 are formed, the first dielectric layer 406 may be formed to cover the entire surface, including the exposed first region 11 (including the first STI structure 201), the fin structures 433, and the second region 12 of the semiconductor substrate 200 exposed by the fin structures 433. Gate structures 213, 214, and 215 may then be formed on the STI structures 201-202 and in the first dielectric layer 406, followed by forming the fourth plug 412, the resistive material layer 207, the second dielectric layer 216, and the conductive plugs 217, 218, 419, and 420, for example, using similar processes as depicted in FIGS. 1-7 and/or FIGS. 8-14.

Although the present invention is disclosed above with various disclosed embodiments, the present invention is not limited thereto. Anyone skilled in the art may make various changes and modifications without departing from the spirit and scope of the present invention. Therefore the scope of the present invention should be defined by the claims thereof.

What is claimed is:

1. A method for forming a semiconductor structure, comprising:

providing a semiconductor substrate;

forming a shallow trench isolation structure in the semiconductor substrate;

forming a first dielectric layer, a first dummy gate structure, and a second dummy gate structure each on a top surface of the semiconductor substrate, wherein the first and second dummy gate structures are formed on the shallow trench isolation structure and through the first dielectric layer, each of the first dummy gate structure and the second dummy gate structure includes a high K dielectric layer and a metal layer on the high K dielectric layer;

forming a resistive material layer on a top surface of each of the first and second dummy gate structures and on a top surface of the first dielectric layer between the first and second dummy gate structures, wherein the resistive material layer physically connects the top surface of the metal layer of each of the first and second dummy gate structures when forming the resistive material layer, the resistive material layer being used to form a resistor;

forming a second dielectric layer on the first dielectric layer and the resistive material layer;

forming a first through-hole in the second dielectric layer and the resistive material layer to expose the first dummy gate structure, and forming a second through-hole in the second dielectric layer and the resistive material layer to expose the second dummy gate structure; and filling the first through-hole with a metallic material to form a first plug, and filling the second through-hole with a metallic material to form a second plug.

2. The method according to claim 1, wherein the first dummy gate structure and the second dummy gate structure are formed by:

forming a first sacrificial gate and a second sacrificial gate on the shallow trench isolation structure;

forming the first dielectric layer on the semiconductor substrate, wherein the first dielectric layer has a top surface coplanar with top surfaces of the first sacrificial gate and the second sacrificial gate;

removing the first sacrificial gate to form a first opening, and removing the second sacrificial gate to form a second opening;

forming a high K dielectric material layer on the top surface of the first dielectric layer and on sidewall surfaces and a bottom surface of each of the first opening and the second opening;

forming a metal material layer on the high K dielectric layer; and removing the high K dielectric material layer and the metal material layer located on the first dielectric layer to form the first dummy gate structure in the first opening, and to form the second dummy gate structure in the second opening.

3. The method according to claim 1, further including:
forming a work function layer and a barrier metal layer between the metal layer and the high K dielectric layer, the barrier metal layer being located on the high K dielectric layer and the work function layer being located on the barrier metal layer.

4. The method according to claim 1, wherein:
the resistive material layer is made of a metal or a metal nitride.

5. The method according to claim 1, wherein:
the resistive material layer is made of TiN, TaN, Ti, Ta, W, or a combination thereof and has a thickness ranging approximately from 10 angstrom to 500 angstroms.

6. A method for forming a semiconductor device, comprising:
providing a semiconductor substrate having a plurality of first regions and a plurality of second regions;
forming a shallow trench isolation structure in the first region of the semiconductor substrate;
forming a first dielectric layer on the semiconductor substrate;
forming a first dummy gate structure, a second dummy gate structure, a first gate structure, and a second gate structure through the first dielectric layer and on the semiconductor substrate, wherein the first and second dummy gate structures are formed on the first region of the semiconductor substrate, and the first and second gate structures are formed on the second region of the semiconductor substrate, the first dummy gate structure, the second dummy gate structure, the first gate structure, and the second gate structure have a same structure including a high K dielectric layer and a metal layer on the high K dielectric layer;
forming a resistive material layer on top surfaces of the first and second dummy gate structures and on a surface of the first dielectric layer located between the first and second dummy gate structures, wherein the resistive material layer physically connects top surfaces of the metal layer of the first and second dummy gate structures when forming the resistive material layer, the resistive material layer being used to form a resistor;
forming a second dielectric layer covering the first dielectric layer and the resistive material layer;
etching the second dielectric layer and the resistive material layer on the first region to form a first through-hole to expose the first dummy gate structure and to form a second through-hole to expose the second dummy gate structure; and
filling the first through-hole with a metallic material to form a first plug passing through the second dielectric layer and the resistive material layer, and on the first dummy gate structure, and filling the second through-hole with a metallic material to form a second plug passing through the second dielectric layer and the resistive material layer, and on the second dummy gate structure.

7. The method according to claim 6, further including:
forming a third plug passing through the second dielectric layer and on the first gate structure on the second region of the semiconductor substrate.

8. The method according to claim 7, further including:
forming a fourth plug passing through the first and second dielectric layers and on source/drain regions of the second gate structure on the second region of the semiconductor substrate,
wherein the source/drain regions are formed on both sides of the second gate structure prior to forming the first dielectric layer.

9. The method according to claim 8, wherein the third plug and the fourth plug are formed by:
etching the second dielectric layer on the second region to form a third through-hole to expose the first gate structure;
etching the first and second dielectric layers to form a fourth through-hole to expose the source/drain regions, wherein one or more of the first, second, third, and fourth through-holes are formed in a same process; and
forming the third and fourth plugs by filling the third and fourth through-holes with a metallic material, while forming the first and second plugs.

10. The method according to claim 6, wherein:
the semiconductor substrate in the second region includes at least one fin structure, and
at least one of the first and second gate structures is disposed across sidewall surfaces and a top surface of a length of the at least one fin structure.

11. The method according to claim 6, wherein:
the resistive material layer is made of a metal or a metal nitride and has a thickness ranging approximately from 10 angstroms to 500 angstroms.

12. The method according to claim 6, wherein the first dummy gate structure, the second dummy gate structure, the first gate structure, and the second gate structure are formed by:
after forming the shallow trench isolation structure, forming a first sacrificial gate and a second sacrificial gate on the shallow trench isolation structure in the first region of the semiconductor substrate, and forming third sacrificial gates on the second region of the semiconductor substrate;
forming the first dielectric layer on the first and second regions of the semiconductor substrate, and having a top surface coplanar with top surfaces of the first, second, and third sacrificial gates;
removing the first, second, and third sacrificial gates to form first, second, third, and fourth openings in the first dielectric layer; and
forming the first dummy gate structure, the second dummy gate structure, the first gate structure, and the second gate structure by filling the first, second, third, and fourth openings in the first dielectric layer with metallic materials.

13. A semiconductor device, comprising:
a shallow trench isolation (STI) structure in a semiconductor substrate;
a first dielectric layer on the semiconductor substrate containing the STI structure,
a first dummy gate structure and a second dummy gate structure in the first dielectric layer and on the STI structure, and the first dummy gate structure is located on one side of the second dummy gate structure, each of the first dummy gate structure and the second dummy gate structure includes a high K dielectric layer and a metal layer on the high K dielectric layer;
a resistive material layer on top surfaces of the first and second dummy gate structures and on a surface of the first dielectric layer located between the first and second dummy gate structures, wherein the resistive material layer physically connects top surfaces of the metal layer of the first and second dummy gate structures when forming the resistive material layer, the resistive material layer being used to form a resistor;
a second dielectric layer on the first dielectric layer and the resistive material layer;
a first plug passing through the second dielectric layer and the resistive material layer and on the first dummy gate structure; and
a second plug passing through the second dielectric layer and the resistive material layer and on the second dummy gate structure.

14. The device according to claim 13, wherein:
the semiconductor substrate includes a first region and a second region, and each of the first and second dielectric layer covers the first and second regions of the semiconductor substrate; and
the first and second plugs are disposed on the first region of the semiconductor substrate.

15. The device according to claim 14, wherein:
a first gate structure and a second gate structure are disposed on the second region of the semiconductor substrate and through the first dielectric layer, and the first and second gate structures are same as the first and second dummy gate structures.

16. The device according to claim 15, further comprising:
a third plug passing through the second dielectric layer and on the first gate structure to electrically connect to the first gate structure on the second region of the semiconductor substrate.

17. The device according to claim 15, wherein:
the semiconductor substrate in the second region includes at least one fin structure, and
at least one of the first and second gate structures are disposed across sidewall surfaces and a top surface of a length of the at least one fin structure.

18. The semiconductor structure according to claim 15, further comprising:
a fourth plug passing through the first and second dielectric layers, and on source/drain regions of the second gate structure on the second region of the semiconductor substrate,
wherein the fourth plug is electrically connected to the source/drain regions formed on both sides of the second gate structure.

* * * * *